United States Patent
Chung et al.

(10) Patent No.: US 9,401,464 B2
(45) Date of Patent: Jul. 26, 2016

(54) DISPLAY APPARATUS WITH SELF-LUMINOUS DISPLAY PANEL

(71) Applicant: SAMSUNG ELECTRONICS CO., LTD., Suwon-si (KR)

(72) Inventors: Seong-eun Chung, Seoul (KR); Dong-Jun Lee, Cheonan-si (KR); Dong-hwan Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 317 days.

(21) Appl. No.: 13/968,008

(22) Filed: Aug. 15, 2013

(65) Prior Publication Data
US 2014/0132489 A1    May 15, 2014

(30) Foreign Application Priority Data
Nov. 15, 2012   (KR) .................. 10-2012-0129632

(51) Int. Cl.
G09G 3/30 (2006.01)
H01L 33/58 (2010.01)
H01L 51/52 (2006.01)
H01L 27/32 (2006.01)

(52) U.S. Cl.
CPC ........ *H01L 33/58* (2013.01); *G09G 3/30* (2013.01); *H01L 27/3211* (2013.01); *H01L 51/5293* (2013.01)

(58) Field of Classification Search
None
See application file for complete search history.

(56) References Cited

U.S. PATENT DOCUMENTS

| 7,473,932 | B2 | 1/2009 | Cho et al. | |
| 7,638,796 | B2 | 12/2009 | Kwak et al. | |
| 7,964,864 | B2 * | 6/2011 | Kumaki et al. | 257/13 |
| 2005/0035353 | A1 * | 2/2005 | Adachi et al. | 257/72 |
| 2005/0196528 | A1 | 9/2005 | Akiyoshi | |
| 2007/0210703 | A1 * | 9/2007 | Izzanni et al. | 313/504 |

FOREIGN PATENT DOCUMENTS

| EP | 1480281 A2 | 11/2004 |
| JP | 2006108093 A | 4/2006 |
| JP | 2008-270061 A | 11/2008 |
| JP | 2009272059 A | 11/2009 |
| KR | 100714016 B1 | 5/2007 |
| KR | 10-2010-0068777 A | 6/2010 |
| KR | 10-2011-0116508 A | 10/2011 |

OTHER PUBLICATIONS

International Search Report (PCT/ISA/210) dated Nov. 25, 2013 from the International Searching Authority in counterpart Application No. PCT/KR2013/007240.

* cited by examiner

Primary Examiner — Joseph Feild
Assistant Examiner — Henok Heyi
(74) Attorney, Agent, or Firm — Sughrue Mion, PLLC

(57) ABSTRACT

A display apparatus having a self-luminous display panel is provided. The self-luminous display panel including: a first electrode layer; a second electrode layer; a substrate which is disposed on a light-emitting surface of the second electrode layer; a light emitting layer which is interposed between the first electrode layer and the second electrode layer, and generates light based on holes and electrons transmitted by voltages applied to the first electrode layer and the second electrode layer; and a linear grid layer which is interposed between the substrate and the second electrode layer, and including linear grids arranged at a predetermined pitch in order to polarize and filter light generated by the light emitting layer and emitted through the substrate.

21 Claims, 14 Drawing Sheets

DISPLAY APPARATUS WITH SELF-LUMINOUS DISPLAY PANEL

CROSS-REFERENCE TO RELATED APPLICATION

This application claims priority from Korean Patent Application No. 10-2012-0129632, filed on Nov. 15, 2012 in the Korean Intellectual Property Office, the disclosure of which is incorporated herein by reference, in its entirety.

BACKGROUND

1. Field

Methods and apparatuses consistent with the exemplary embodiments relate to a display panel configured to display an image on a flat surface, and a display apparatus having the same. More particularly, the exemplary embodiments relate to a self-luminous display panel and a display apparatus having the same which has an improved structure for polarizing and filtering light and converting the light into light in a desired color and displays the light on a panel which displays an image, through self-generated light, without an additional backlight for emitting light.

2. Description of the Related Art

A display apparatus is an apparatus which includes a display panel for displaying an image thereon, and displays a broadcast signal or image signals/image data in various formats, and may be implemented as a TV or a monitor. The display panel is implemented as various types of devices such as a liquid crystal display (LCD) panel, plasma display panel (PDP), etc. depending on its characteristics, and is used in various display apparatuses.

The display panel of the display apparatus may be classified into a light receiving panel and a self-luminous panel according to a light-generating method. The light receiving panel does not emit light by itself and thus includes a backlight which generates and emits light to the panel. An example of a light receiving panel includes an LCD panel. The self-luminous panel emits light by itself and does not need a backlight. An example of a self-luminous panel includes an organic light emitting diode (OLED) panel.

The self-luminous display panel includes a polarizing layer which polarizes and filters light emitted by the panel, and a color filter layer which converts the emitted light into RGB colors. However, as the polarizing layer and color filter layer have high light reflection/absorption rates, light efficiency across the panel is low. In particular, the color filter layer includes an RGB dye layer, which transmits light only in a necessary wavelength area, and reflects or absorbs light in other wavelength areas, resulting in a decrease in light efficiency.

SUMMARY

According to an aspect of an exemplary embodiment, there is provided a self-luminous display panel of a display apparatus including: a first electrode layer; a second electrode layer; a substrate which is disposed on a light-emitting surface of the second electrode layer; a light emitting layer which is interposed between the first electrode layer and the second electrode layer, and generates light based on holes and electrons transmitted by voltages applied to the first electrode layer and the second electrode layer; and a linear grid layer which is interposed between the substrate and the second electrode layer, and includes linear grids arranged at a predetermined pitch in order to polarize and filter light generated by the light emitting layer and emitted through the substrate.

The linear grid layer may filter the emitted light to transmit light in a preset direction of polarization, and an extension direction of the linear grid layer may be determined according to the direction of polarization.

Each pixel of the display panel may include a plurality of sub-pixels which corresponds to a plurality of colors, and the linear grid layer may filter the emitted light to emit light in each color with respect to the plurality of sub-pixels.

The pitch of the linear grid may be set differently with respect to each sub-pixel which corresponds to a wavelength of the colors.

The linear grid may include a red linear grid, a green linear grid and a blue linear grid which respectively corresponds to the plurality of sub-pixels of RGB colors, and the pitch of the green linear grid may be smaller than that of the red linear grid and larger than that of the blue linear grid.

The linear grid may be formed by placing at least one of a metal layer and an insulating layer along a moving direction of the emitted light.

The self-luminous display panel may further include an electron transport layer which is interposed between the first electrode layer and the light emitting layer and transports the electrons, and a hole transport layer which is interposed between the second electrode layer and the light emitting layer and transports the holes, wherein the light emitting layer generates light based on the electrons transported by the electron transport layer and holes transmitted by the hole transport layer.

According to an aspect of another exemplary embodiment, there is provided a display apparatus including: a signal receiver configured to receive an image signal; a signal processor configured to process the image signal received by the signal receiver, according to a preset image processing operation; and a self-luminous display panel configured to display an image thereon based on the image signal processed by the signal processor, the self-luminous display panel including: a first electrode layer; a second electrode layer; a substrate which is disposed on an light-emitting surface of the second electrode layer; a light emitting layer which is interposed between the first electrode layer and the second electrode layer, and generates light based on holes and electrons transmitted by voltages applied to the first electrode layer and the second electrode layer; and a linear grid layer which is interposed between the substrate and the second electrode layer, and includes linear grids arranged at a predetermined pitch in order to polarize and filter light generated by the light emitting layer and emitted through the substrate.

The linear grid layer may filter the emitted light to transmit light in a preset direction of polarization, and an extension direction of the linear grid layer may be determined according to the direction of polarization.

Each pixel of the display panel may include a plurality of sub-pixels which correspond to a plurality of colors, and the linear grid layer may filter the emitted light to emit light in each color with respect to the plurality of sub-pixels.

The pitch of the linear grid may be set differently with respect to each sub-pixel which corresponds to a wavelength of the colors.

The linear grid may include a red linear grid, a green linear grid and a blue linear grid which corresponds respectively to the plurality of sub-pixels of RGB colors, and the pitch of the green linear grid may be smaller than that of the green linear grid and may be larger than that of the blue linear grid.

The linear grid may be formed by placing at least one of a metal layer and an insulating layer along a moving direction of the emitted light.

The self-luminous display panel may further including an electron transport layer between the first electrode layer and the light emitting layer and transports the electrons, and a hole transport layer between the second electrode layer and the light emitting layer and transports the holes, wherein the light emitting layer generates light based on the electrons transported by the electron transport layer and holes transmitted by the hole transport layer.

According to an aspect of another exemplary embodiment, there is provided a self-luminous display panel including: a light emitting layer configured to generate light based on holes and electrons transmitted by voltages applied to a first electrode layer and a second electrode layer; and a linear grid layer configured to be arranged at a predetermined pitch in order to polarize and filter light generated by the light emitting layer and emitted through a substrate.

A display apparatus may include the self-luminous display panel. The self-luminous display panel may further include a first electrode layer. The self-luminous display panel may further include a second electrode layer.

BRIEF DESCRIPTION OF THE DRAWINGS

The above and/or other aspects will become apparent and more readily appreciated from the following description of the exemplary embodiments, taken in conjunction with the accompanying drawings, in which.

DETAILED DESCRIPTION OF THE EXEMPLARY EMBODIMENTS

Figure 1:
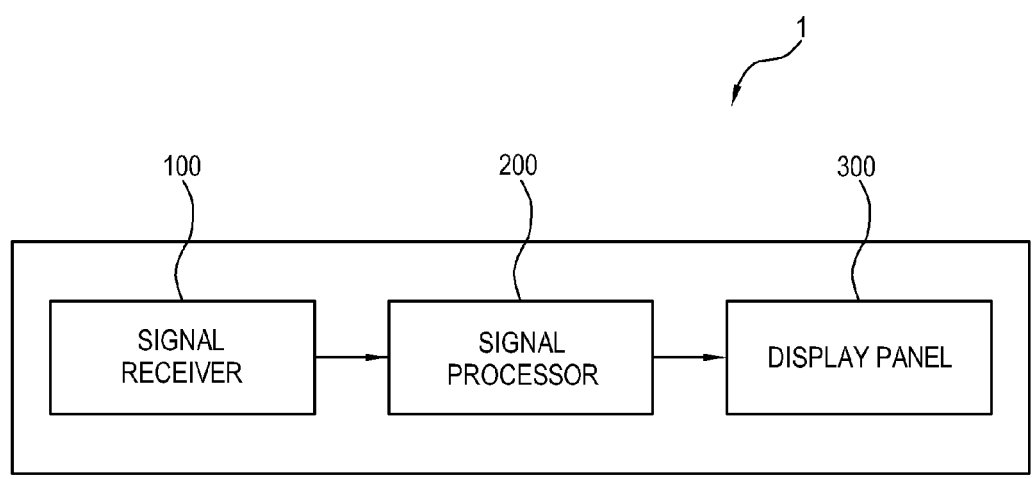
FIG. 1 is a block diagram of a display apparatus according to an exemplary embodiment.

Below, exemplary embodiments will be described in detail with reference to accompanying drawings so as to be easily understood by a person having ordinary knowledge in the art. The exemplary embodiments may be embodied in various forms without being limited to the exemplary embodiments set forth herein. Descriptions of well-known parts are omitted for clarity, and like reference numerals refer to like elements throughout.

FIG. 1 is a block diagram of a display apparatus 1 according to an exemplary embodiment.

As shown therein, the display apparatus 1 includes a signal receiver 100 which receives an image signal, a signal processor 200 which processes the image signal received by the signal receiver 100, according to a preset image processing operation, and a display panel 300 which displays an image thereon based on the image signal processed by the signal processor 200.

The display apparatus 1 according to an exemplary embodiment may be implemented as a TV, but is not limited thereto. For example, the spirit of the exemplary embodiments may apply to any type of device which is capable of displaying an image based on image signals/image data supplied from the outside or provided therein, e.g., apply to the display apparatus 1 from among various types of devices for displaying images, such as a monitor, portable media player (PMP), a mobile phone, etc.

The signal receiver 100 receives and transmits image signals/image data to the signal processor 200. The signal receiver 100 may be implemented as various types of devices which correspond to a standard of a received image signal and a type of embodiment of the display apparatus 1. For example, the signal receiver 100 may receive radio frequency (RF) signals in a wireless manner from a broadcast station (not shown), or may receive image signals in a wired manner according to standards such as composite video, component video, super video, SCART, high definition multimedia interface (HDMI), DisplayPort, unified display interface (UDI) or wireless HD. In response to the image signal being a broadcast signal, the signal receiver 100 includes a tuner to tune the broadcast signal, per channel. Otherwise, the signal receiver 100 may receive image data packet from a server (not shown) through a network.

The signal processor 200 performs various image processing operations with respect to the image signal received by the signal receiver 100. The signal processor 200 outputs the processed image signal to the display panel 300, on which an image is displayed on the basis of the received image signal.

The image processing operation of the signal processor 200 may include, but is not limited to, a decoding operation which corresponds to image formats of image data, a de-interlacing operation for converting interlace image data into progressive image data, a scaling operation for adjusting image data into preset resolution, a noise reduction operation for improving an image quality, a detail enhancement operation, a frame refresh rate conversion, etc.

The signal processor 200 may be implemented as a system-on-chip (SoC) which performs integrated functions or may be implemented as an image processing board (not shown) that is formed by installing individual groups which independently perform the foregoing operations on a printed circuit board (PCB), and are then installed in the display apparatus 1.

The display panel 300 displays an image thereon based on the image signal output by the signal processor 200. The display panel 300 according to the exemplary embodiments may include a self-luminous panel rather than a non-light emitting panel such as an LCD panel. For example, the display panel 300 may be implemented as an OLED panel.

Hereinafter, a configuration of the display panel 300 according to an exemplary embodiment will be described with reference to FIG. 2.

Figure 2:
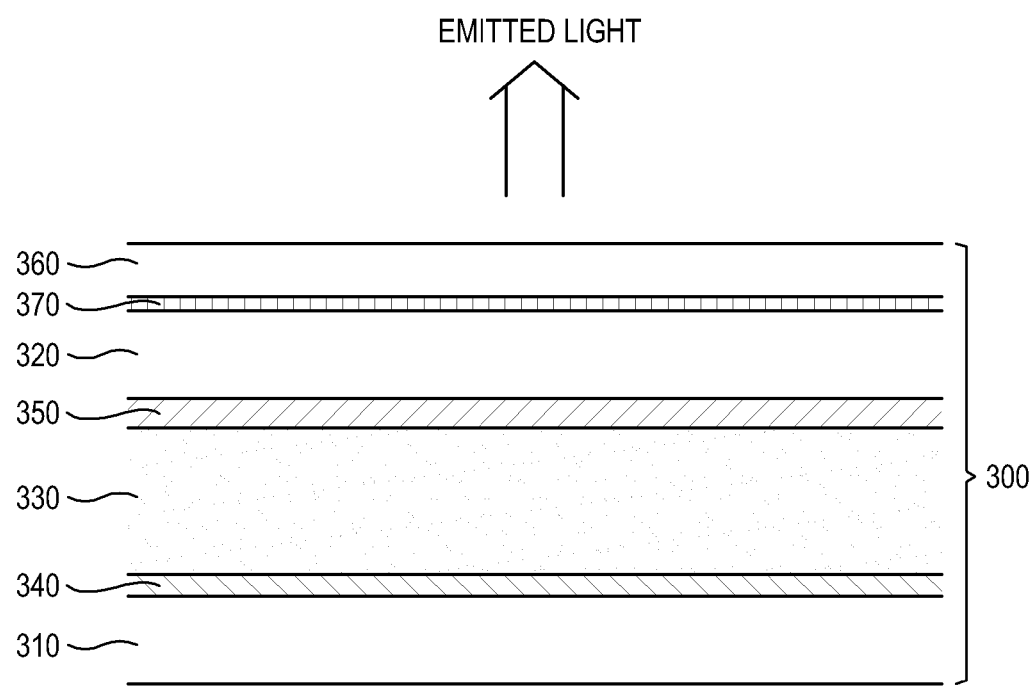
FIG. 2 is a lateral sectional view of a display panel of the display apparatus in FIG. 1.

FIG. 2 is a lateral sectional view of the display panel 300.

As shown therein, the display panel 300 includes a first electrode layer 310, a second electrode layer 320 facing the first electrode layer 310, a light emitting layer 330 interposed between the first and second electrode layers 310 and 320, an electron transport layer 340 interposed between the first electrode layer 310 and the light emitting layer 330, a hole transport layer 350 interposed between the light emitting layer 330 and the second electrode layer 320, a substrate 360 provided on a light emitting surface of the second electrode layer 320, and a linear grid layer 370 interposed between the substrate 360 and the second electrode layer 320.

The terms "upper part/upper side and lower part/lower side" in the sections below refer to relative arrangement or placement relationship among elements along a moving direction of the light emitted by the display panel 300. For example, when light is generated and emitted by the display panel 300 to the upper side of the display panel 300, the display panel 300 is formed by sequentially placing the electron transport layer 340, light emitting layer 330, hole transport layer 350, second electrode layer 320, linear grid layer 370 and substrate 360 on the upper side of the first electrode layer 310.

Hereinafter, a configuration of generating light by the display panel 300 will be described.

The first electrode layer 310 and the second electrode layer 320 are respectively implemented as cathode and anode layers. As negative and positive voltages are applied to the first and second electrode layers 310 and 320, respectively, electrons are generated by the first electrode layer 310 and holes are generated by the second electrode layer 320. The electron transport layer 340 transports electrons of the first electrode layer 310 to the light emitting layer 330, while the hole transport layer 350 transports holes of the second electrode layer 320 to the light emitting layer 330.

The electrons and holes transported to the light emitting layer 330 form exiton in the light emitting layer 330. The exiton refers to neutral particles which are a combination of electrons and holes freely moving in a unit within non-metal crystal. The exiton generates light when being changed from an excited state to a ground state. Thus, the light emitting layer 330 generates and emits light to the substrate 360.

Improvement of emission efficiency of the light emitting layer 330 may be achieved by improving the generated quantity or transported quantity of holes and electrons. Thus, the display panel 300 may further include an electron injection layer (not shown) interposed between the first electrode layer 310 and the electron transport layer 340, and a hole injection layer (not shown) interposed between the hole transport layer 350 and the second electrode layer 320, depending on its type of design.

The light emitting layer 330 may generate light in a desired color depending on its type of embodiment. However, the light emitting layer 330 according to an exemplary embodiment emits white light through a continuous structure of RGB colors or through the usage of mixed organic matters.

Hereinafter, a structure of the linear grid layer 370 will be described with reference to FIG. 3.

Figure 3:
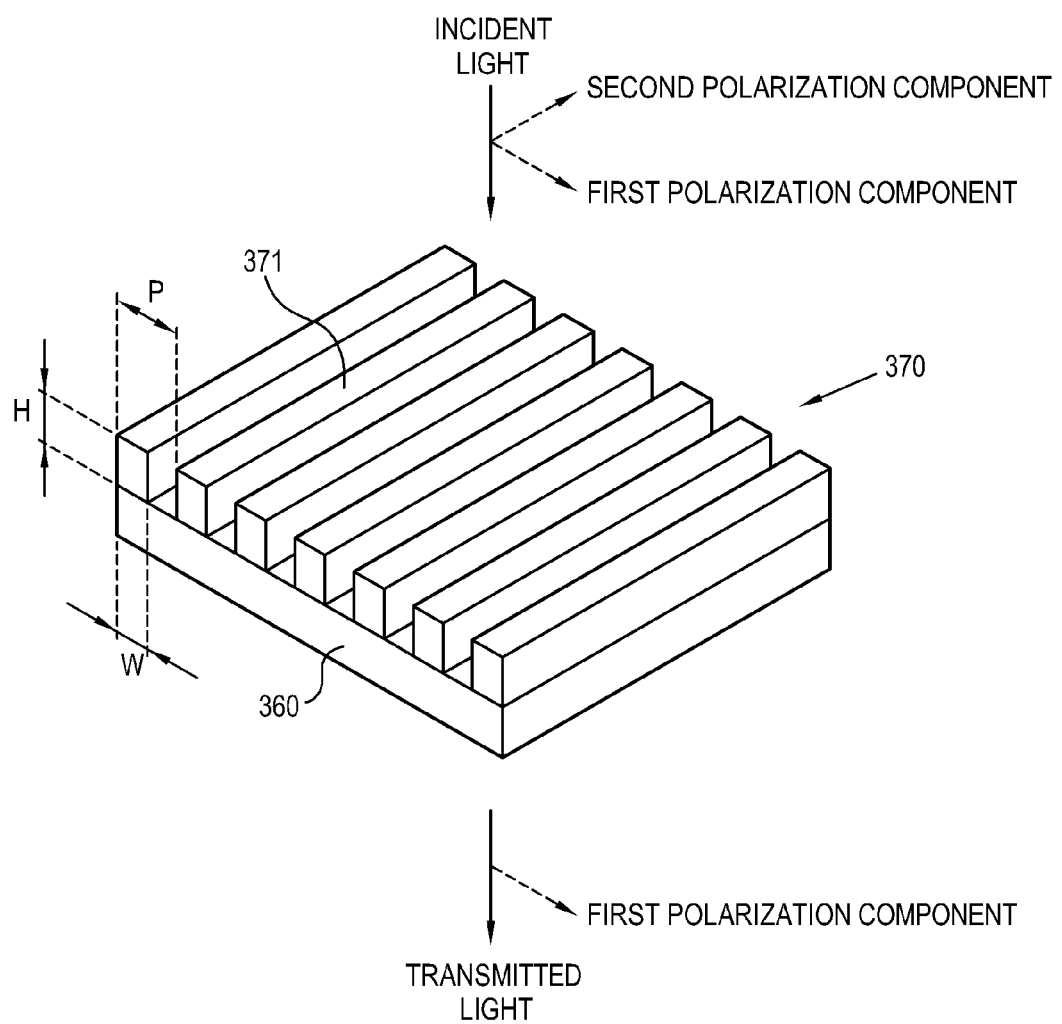
FIG. 3 is a perspective view of a linear grid layer of the display panel in FIG. 2.

FIG. 3 is a perspective view of the linear grid layer 370.

As shown therein, the linear grid layer 370 may be implemented by arranging linear grids 371 shaped like a bar elongated in a certain direction, on the substrate 360. The linear grids 371 have a preset height H, width W and pitch P, and are formed on a flat surface of the substrate 360, to which light is incident from light emitting layer 330.

In response to the pitch P of the linear grids 371 being adjusted by ½ wave length of light, only transmitted light and reflected light are present, rather than diffracted waves. A slit is formed between two adjacent linear grids 371, and when incident light passes through the slit, a first polarizing component passes through the linear grid layer 370 along a first direction of polarization which is perpendicular to a direction of extension of the linear grids 371. A second polarizing component is reflected again along a second direction of polarization in parallel with the direction of extension of the linear grids 371. That is, the light which passes through the linear grid layer 370 is polarized and filtered along the first polarization direction, due to the foregoing structure of the linear grids 371.

The light which is reflected from the linear grid layer 370 rather than passing therethrough, may be reflected again toward the linear grid layer 370 by installing an additional reflection panel (not shown) in a lower side of the display panel 300. The re-reflected light may be repeatedly polarized and filtered by the structure of the linear grid layer 370, and finally emitted from the display panel, 300 as light in the first direction of polarization.

The linear grid layer 370 may be formed by depositing a metal layer on the substrate 360, and patterning the linear grids 371 by nano imprint lithography (NIL), whereby light is reflected when the direction of polarization of the light is in parallel with the grids, and passes through the linear grid layer 370 when the direction of polarization is perpendicular to the grid.

Figure 4:
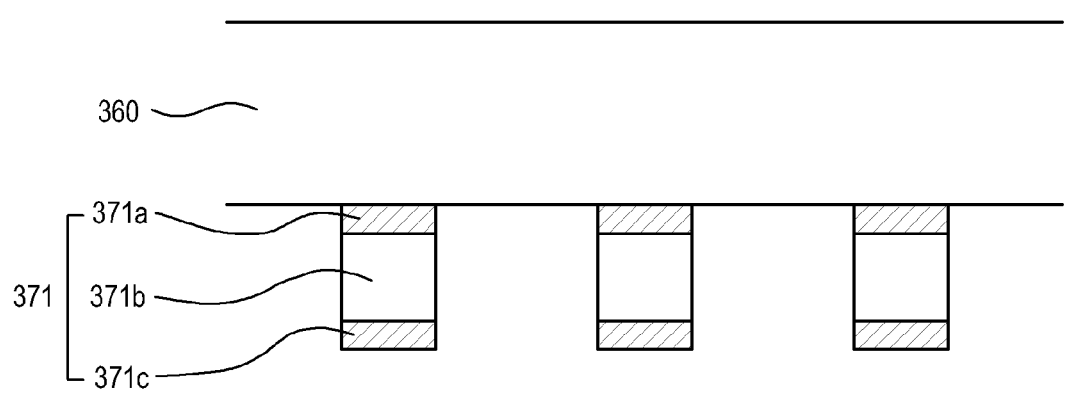
FIGS. 4 to 6 are lateral sectional views of the linear grid layer in FIG. 3.
Figure 5:
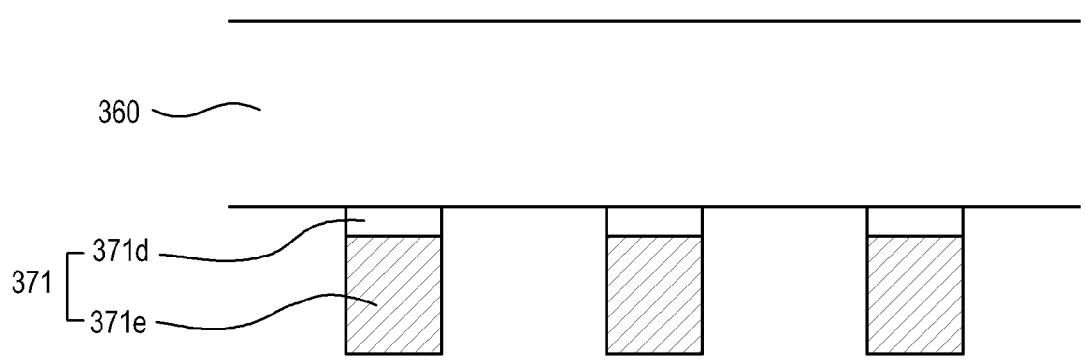
Figure 6:
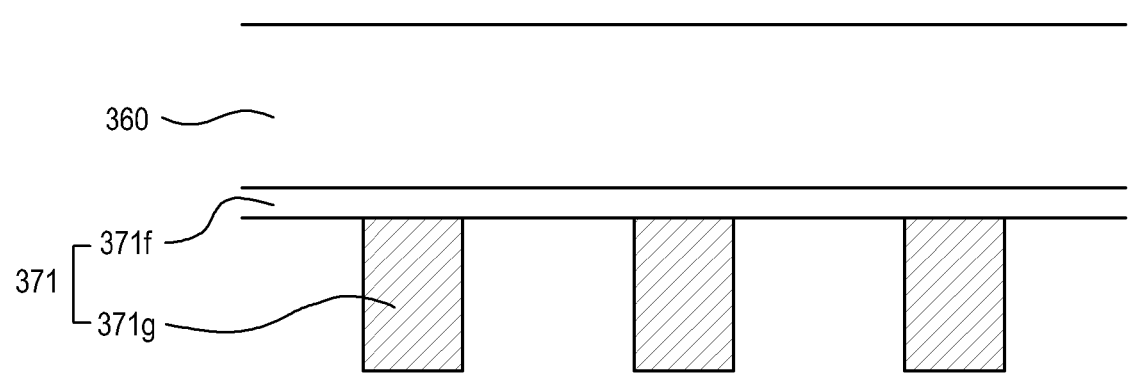

FIGS. 4 to 6 are lateral sectional views of the linear grid layer 370.

As shown in FIG. 4, the linear grid layer 370 includes a plurality of linear grids 371 which stands on a lower surface of the substrate 360, i.e., on a light incident surface of the substrate 360. The respective linear grids 371 protrude toward the light emitting layer 330. A first metal layer 371a, an insulating layer 371b and a second metal layer 371c are sequentially formed on the lower surface of the substrate 360.

The first and second metal layers 371a and 371c include metal such as Au, Al, Cu and Ag, through which electrons may be easily emitted through external stimulus. The insulating layer 371b includes a dielectric such as ZnSe, TiQ2, etc.

As shown in FIG. 5, the linear grids 371 may include an insulating layer 371d and a metal layer 371e which are sequentially formed on a lower surface of the substrate 360.

As shown in FIG. 6, the linear grids 371 may include an insulating layer 371f which is coated across the lower surface of the substrate 360, and a metal layer 371g formed in a grid pattern on the insulating layer 371f.

As above, the respective linear grids 371 of the linear grid layer 370 may be implemented as various structures.

However, as the light emitting layer 330 according to an exemplary embodiment emits white light, light emitted by the display panel 300 should be color-filtered to display a color image on the display panel 300.

Accordingly, the linear grid layer 370 further includes a structure for color-filtering incident light as well as a structure for polarizing and filtering incident light. Such structures of the linear grid layer 370 will be described below.

Figure 7:
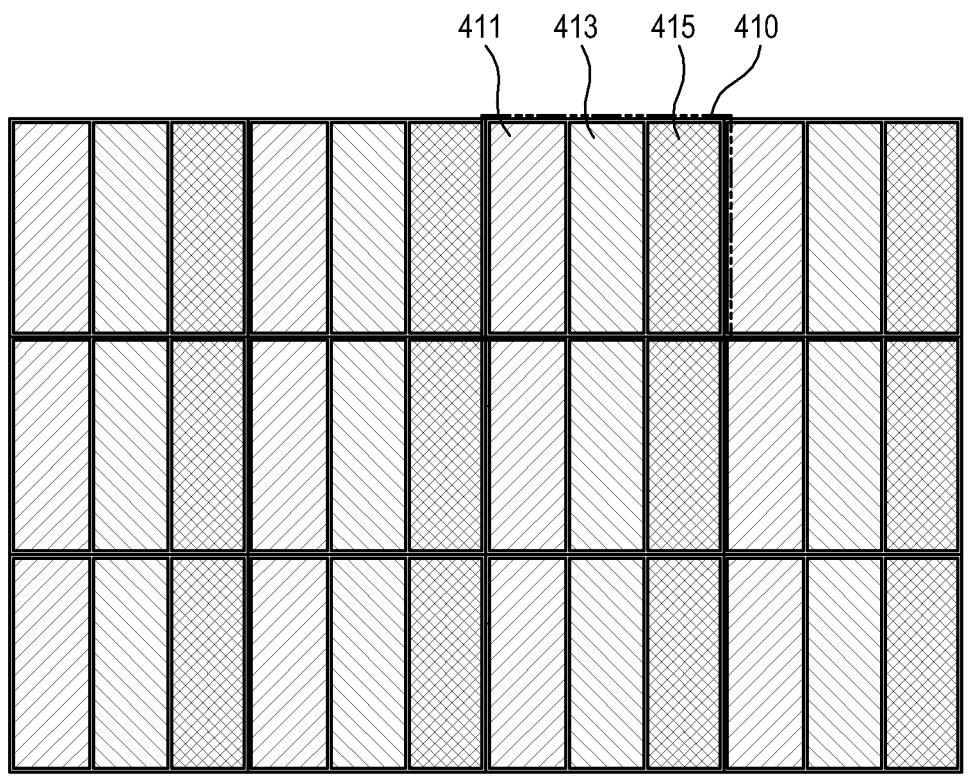
FIG. 7 illustrates an example of sub-pixels per color with respect to pixels of the display panel in FIG. 2.

FIG. 7 illustrates an example of sub-pixels 411, 413 and 415 per color with respect to respective pixels 410 of the display panel 300.

As shown therein, one pixel 410 includes three sub-pixels 411, 413 and 415 which correspond to the three colors of RGB. That is, the pixel 410 includes a red sub-pixel 411 which corresponds to a light emitting area of red color, a green sub-pixel 413 which corresponds to a light emitting area of green color, and a blue sub-pixel 415 which corresponds to a light emitting area of blue color.

The linear grid layer 371 basically includes the structure as in FIG. 3, but has different pitches which correspond to the sub-pixels 411, 413 and 414 with respect to each color.

Figure 8:
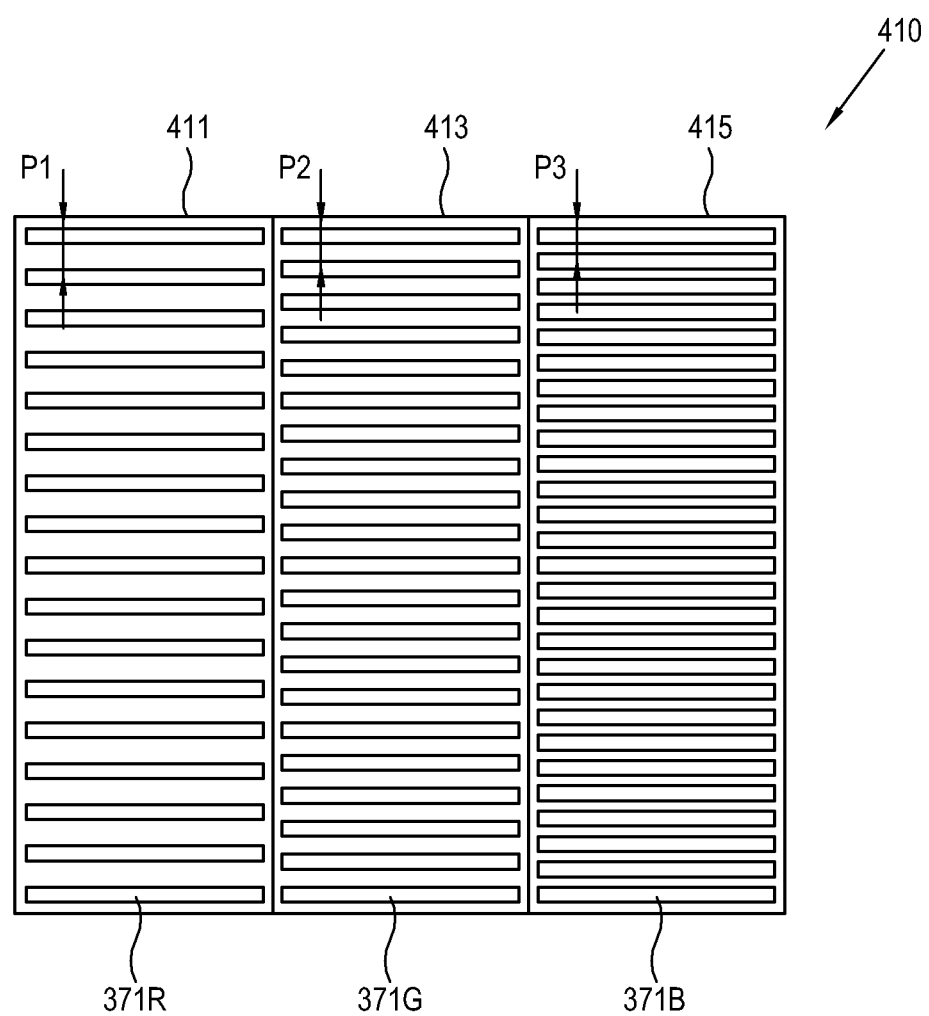
FIG. 8 is a plan view of a linear grid corresponding to sub-pixels of the linear grid layer in FIG. 2.

FIG. 8 is a plan view of linear grids 371R, 371G and 371B which correspond to the respective sub-pixels 411, 413 and 415 in FIG. 7.

As shown therein, the linear grids 371R, 371G and 371B include a red linear grid 371R formed in an area which corresponds to the red sub-pixel 411, a green linear grid 371G formed in an area which corresponds to the green sub-pixel 413, and a blue linear grid 371B formed in an area which corresponds to the blue sub-pixel 415.

The pitches P1, P2 and P3 of the RGB color linear grids 371R, 371G and 371B are set to correspond to the concerned color. For example, the pitch P1 of the red linear grid 371R is smaller than ½ of red light wavelength; the pitch P2 of the green linear grid 371G is smaller than ½ of green light wavelength; and the pitch P3 of the blue linear grid 371B is smaller than ½ of blue light wavelength. As the pitches of the linear grids 371R, 371G and 371B are set differently for each of the sub-pixels 411, 413 and 415, the wavelength of incident light is adjusted for the sub-pixels 411, 413 and 415 in order for the sub-pixels to emit different color light.

The pitch P1 of the red linear grid 371R is approximately 330 to 390 nm which is smaller than ½ of the red light wavelength. Incident light is changed to red light having a first polarization component when passing through the red linear grid 371R. The pitch P2 of the green linear grid 371G is approximately 250 to 290 nm. The pitch P3 of the blue linear grid 371B is approximately 220 to 240 nm. That is, the pitches P1, P2 and P3 of the linear grids 371R, 371G and 371B become smaller in the order of R, G and B. The aforementioned figures apply to an exemplary embodiment where the linear grids 371R, 371G and 371B have such structure that "metal layer-insulating layer-metal layer" (refer to FIG. 4).

However, it shall be understood that such figures only represent an example, and do not limit the spirit of the exemplary embodiment. In response to the linear grids 371R, 371G and 371B having such structure as "insulating layer-metal layer" (refer to FIG. 5 or 6), the pitch P1 of the red linear grid 371R is 440 to 400 nm, the pitch P2 of the green linear grid 371G is 340 to 300 nm, and the pitch P3 of the blue linear grid 371B is 260 to 220 nm. As above, the figures of P1, P2 and P3 may vary depending on the structure of the linear grids 371R, 371G and 371B.

To manufacture the linear grid structure as above, the following manufacturing process may apply.

FIGS. 9 to 14 are examples of a process of manufacturing the linear grid.

Figure 9:
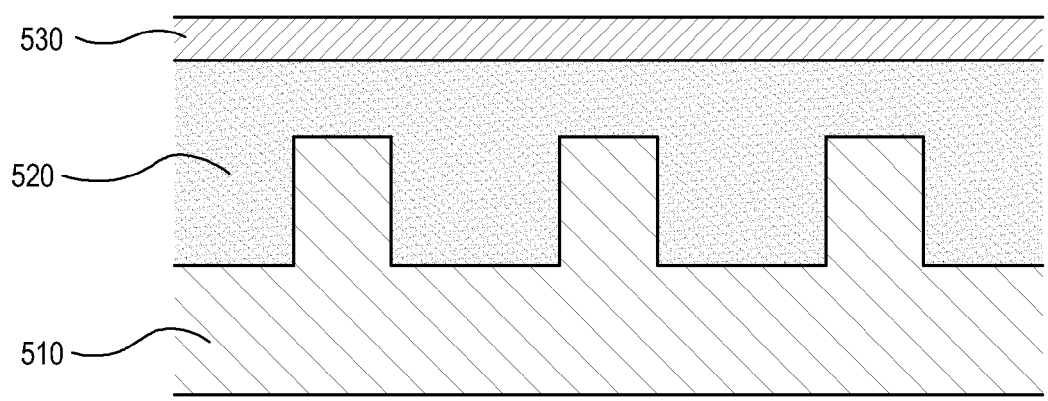
FIGS. 9 to 14 illustrate examples of a process of manufacturing the linear grid layer in FIG. 2.

As shown in FIG. 9, a manufacturer manufactures a master mold 510. The master mold 510 includes a resin mold in which the linear grid structure according to the above exemplary embodiment is formed on an upper surface. Various methods may apply to manufacture the master mold 510. For example, the manufacturer applies an ultraviolet cured resin layer on a flat glass/plate, rolls a cylindrical mold having linear grid patterns on the resin layer in a certain direction or presses the resin layer with the plate mold having linear grid patterns. In response to the linear grid structure being formed on the resin layer in the above manner, the manufacturer irradiates the resin layer with ultraviolet rays to cure the resin layer. Then, the resin master mold 510 is manufactured.

The manufacturer coats the master mold 510 with polyvinyl alcohol (PVA) layer 520. PVA includes polyvinyl polymer and is generated by changing carboxylic acid group to hydroxyl group. PVA is soluble as it includes the hydroxyl group. That is, PVA may be cleansed by water for removal.

The manufacturer applies adhesive to the PVA layer 520 and places a carrier 530 thereon. The carrier 530 includes a flat plate, a material of which is not limited.

In response to the carrier 530 being adhered to the PVA layer 520, the manufacturer separates the PVA layer 520 from the master mold 510 to thereby manufacture the PVA mold 520.

Figure 10:
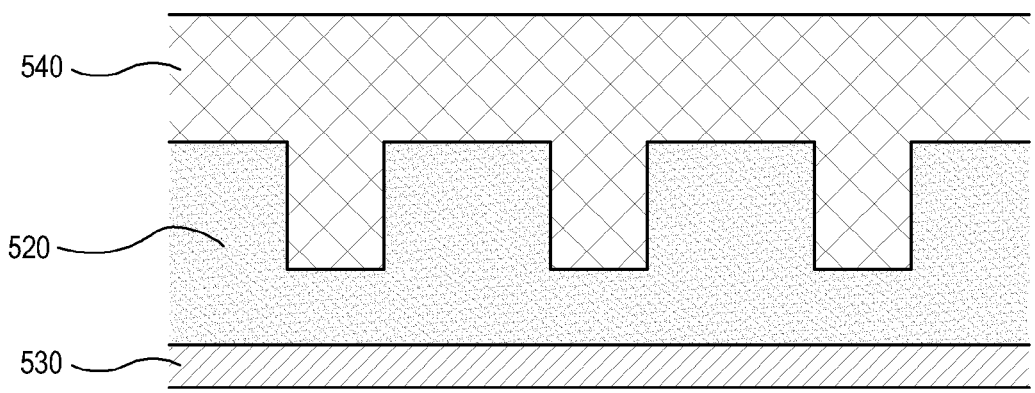

As shown in FIG. 10, the manufacturer places the PVA layer 520 upward and the carrier 530 downward. The manufacturer coats a photoresist layer 540 on the PVA layer 520.

Figure 11:
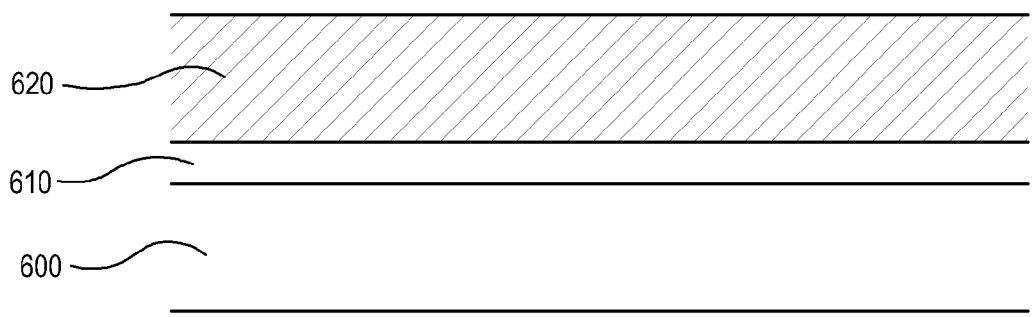

Then, a second mold is prepared for forming the linear grid. As shown in FIG. 11, the manufacturer sequentially coats a preset grid material, e.g., the insulating layer 610 and metal layer 620 on a glass 600. The glass 600 is the substrate 600 of the display panel 300. Then, the manufacturer places the second mold on the metal layer 620 as shown in FIG. 10.

The grid material according to an exemplary embodiment includes the insulating layer 610 and metal layer 620, but otherwise may include one of the insulating layer 610 and the metal layer 520 or include two or more layers of the insulating layer 610 or the metal layer 620, depending on the type of design.

Figure 12:
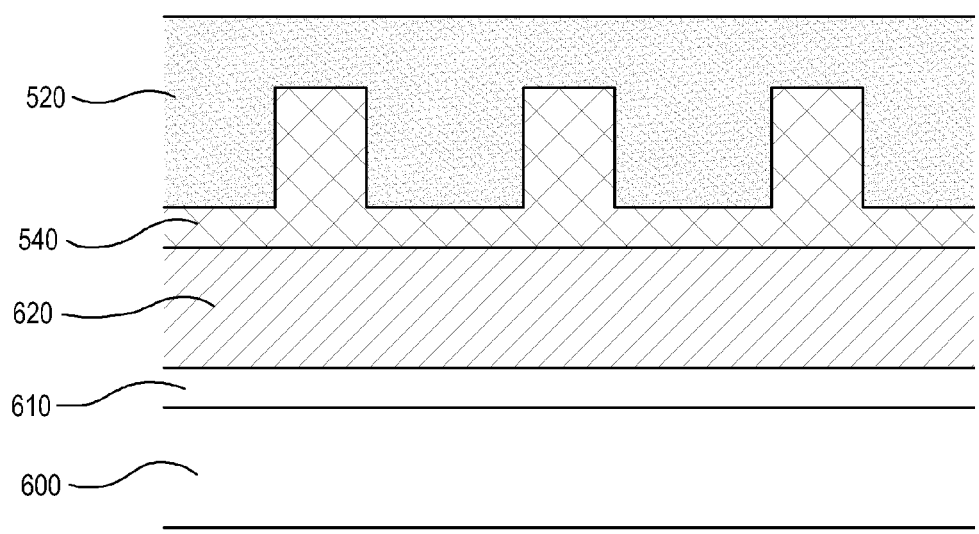

As shown in FIG. 12, the manufacturer places the second mold (refer to FIG. 10) on the metal layer 620. The manufacturer places the photoresist layer 540 directly on the metal layer 620. That is, the manufacturer turns the second mold (refer to FIG. 10) upside down and places it on the metal layer 620. The manufacturer removes the carrier 530 (refer to FIG. 10) so that the PVA layer 520 is provided on top of the glass 600.

The manufacturer removes the PVA layer 520 by cleansing it with water. PVA is soluble and is easily removed from the photoresist layer 540 by water cleansing.

Figure 13:
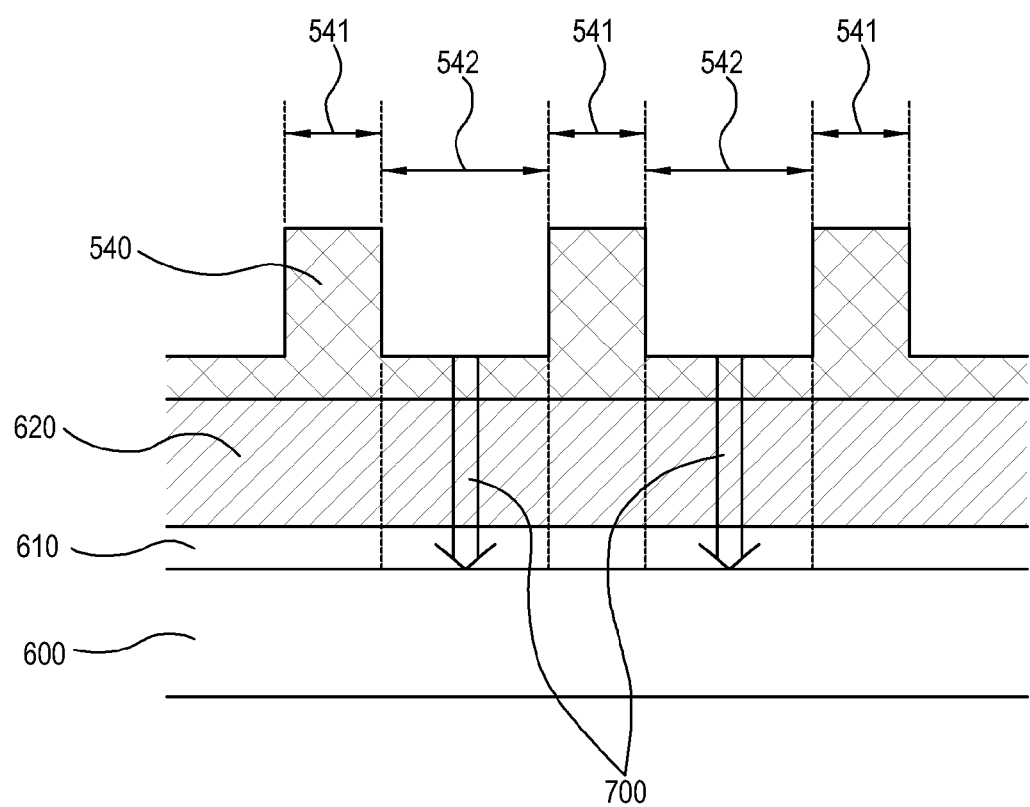

As shown in FIG. 13, the manufacturer performs etching 700 to the glass 600 while the photoresist layer 540 is placed on top thereof. The etching may include various etching types including dry etching by oxygen or argon gas.

The photoresist layer 540 has a relatively thicker area 541 and a thinner area 542 which are alternatively arranged, and the metal layer 620 and insulating layer 610 which correspond to the thinner area are eroded by the etching. The metal layer 620 which corresponds to the thicker area 541 may not be eroded as the erosion is delayed by the photoresist layer 540.

Figure 14:
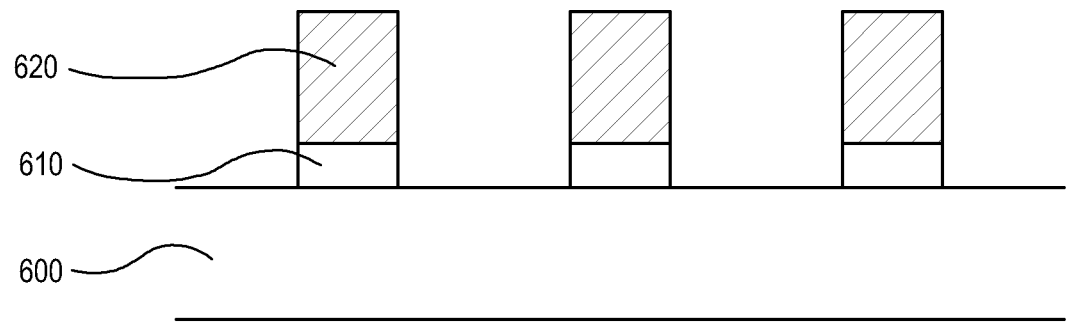

As shown in FIG. 14, when the etching is completed, the manufacturer removes the remainder of the photoresist layer 540, and then, the linear grid is formed on the glass 600 by the insulating layer 610 and the metal layer 620.

Through the aforementioned process, a linear grid of a large screen may be formed on a substrate.

Although a few exemplary embodiments have been shown and described, it will be appreciated by those skilled in the art that changes may be made in these exemplary embodiments without departing from the principles and spirit of the invention, the range of which is defined in the appended claims and their equivalents.

What is claimed is:

1. A self-luminous display panel of a display apparatus, the self-luminous display panel comprising:
    a first electrode layer;
    a second electrode layer;
    a substrate which is disposed on an light-emitting surface of the second electrode layer;
    a light emitting layer which is interposed between the first electrode layer and the second electrode layer, and generates light based on holes and electrons transmitted by voltages applied to the first electrode layer and the second electrode layer; and
    a linear grid layer which is interposed between the substrate and the second electrode layer, the linear grid layer comprising linear grids arranged at a predetermined pitch in order to polarize and filter light generated by the light emitting layer and emitted through the substrate.

2. The self-luminous display panel of claim 1, wherein the linear grid layer is configured to filter the emitted light to transmit light in a preset direction of polarization, and a direction of an extension of the linear grid layer is determined according to the direction of polarization.

3. The self-luminous display panel of claim 2, wherein each pixel of the display panel comprises a plurality of sub-pixels which correspond to a plurality of colors, and the linear grid layer filters the emitted light to emit light in each color with respect to the plurality of sub-pixels.

4. The self-luminous display panel of claim 3, wherein the pitch of the linear grid is set differently with respect to each sub-pixel which corresponds to a wavelength of the colors.

5. The self-luminous display panel of claim 3, wherein the linear grid comprises a red linear grid, a green linear grid and a blue linear grid which respectively correspond to the plurality of sub-pixels of RGB colors, and the pitch of the green linear grid is smaller than that of the red linear grid and larger than the pitch of the blue linear grid.

6. The self-luminous display panel of claim 3, wherein the pitch of the red linear grid is smaller than ½ of red light wavelength, the pitch of the green linear grid is smaller than ½ of green light wavelength, and pitch of the blue linear grid is smaller than ½ of blue light wavelength.

7. The self-luminous display panel of claim 1, wherein the linear grid is formed by placing at least one of a metal layer and an insulating layer along a moving direction of the emitted light.

8. The self-luminous display panel of claim 1, further comprising an electron transport layer which is interposed between the first electrode layer and the light emitting layer and transports the electrons, and a hole transport layer which is interposed between the second electrode layer and the light emitting layer and transports the holes, wherein the light emitting layer is configured to generate light based on the electrons transported by the electron transport layer and holes transmitted by the hole transport layer.

9. The self-luminous display panel of claim 1, wherein the linear grids comprise a plurality of bars which are disposed on the substrate and elongated in a predetermined direction.

10. The self-luminous display panel of claim 9, wherein the plurality of bars have a predetermined height and width, and the pitch of the plurality of bars are being adjusted by ½ wavelength of light emitted from the light emitting layer.

11. The self-luminous display panel of claim 10, wherein the predetermined polarization direction is a direction perpendicular to the linear grid layer.

12. The self-luminous display panel of claim 9, wherein the plurality of bars have rectangular cross sections.

13. The self-luminous display panel of claim 1, wherein a slit is formed between two adjacent linear grids and a light polarized along a predetermined direction passes through the slit.

14. A display apparatus comprising:
a signal receiver configured to receive an image signal;
a signal processor configured to process the image signal received by the signal receiver, according to a preset image processing operation; and
a self-luminous display panel configured to display an image thereon based on the image signal processed by the signal processor, the self-luminous display panel comprising:
a first electrode layer;
a second electrode layer;
a substrate which is disposed on an light-emitting surface of the second electrode layer;
a light emitting layer which is interposed between the first electrode layer and the second electrode layer, and generates light based on holes and electrons transmitted by voltages applied to the first electrode layer and the second electrode layer; and
a linear grid layer which is interposed between the substrate and the second electrode layer, the linear grid layer comprising linear grids arranged at a predetermined pitch in order to polarize and filter light generated by the light emitting layer and emitted through the substrate.

15. The display apparatus of claim 14, wherein the linear grid layer filters the emitted light to transmit light in a preset direction of polarization, and a direction of extension of the linear grid layer is determined according to the direction of polarization.

16. The display apparatus of claim 15, wherein each pixel of the display panel comprises a plurality of sub-pixels which correspond to a plurality of colors, and the linear grid layer filters the emitted light to emit light in each color with respect to the plurality of sub-pixels.

17. The display apparatus of claim 16, wherein the pitch of the linear grid is set differently with respect to each sub-pixel which corresponds to a wavelength of the colors.

18. The display apparatus of claim 16, wherein the linear grid comprises a red linear grid, a green linear grid and a blue linear grid which respectively corresponds to the plurality of sub-pixels of RGB colors, and the pitch of the green linear grid is smaller than that of the red linear grid and larger than that of the blue linear grid.

19. The display apparatus of claim 14, wherein the linear grid is formed by placing at least one of a metal layer and an insulating layer along a direction of movement of the emitted light.

20. The display apparatus of claim 14, the self-luminous display panel further comprising an electron transport layer which is interposed between the first electrode layer and the light emitting layer and transports the electrons, and a hole transport layer which is interposed between the second electrode layer and the light emitting layer and transports the holes, wherein the light emitting layer is configured to generate light based on the electrons transported by the electron transport layer and holes transmitted by the hole transport layer.

21. A self-luminous display panel comprising:
a light emitting layer configured to generate light based on holes and electrons transmitted by voltages applied to a first electrode layer and a second electrode layer; and
a linear grid layer configured to be arranged at a predetermined pitch in order to polarize and filter light generated by the light emitting layer and emitted through a substrate.

* * * * *